United States Patent [19]
Ha et al.

[11] Patent Number: 5,824,155
[45] Date of Patent: Oct. 20, 1998

[54] METHOD AND APPARATUS FOR DISPENSING VISCOUS MATERIAL

[75] Inventors: Vinh Van Ha, Southfield; John Trublowski; Brenda Joyce Nation, both of Troy; Jeff Lin, Canton; Chin-Yuan Perng, Ann Arbor, all of Mich.

[73] Assignee: Ford Motor Company, Dearborn, Mich.

[21] Appl. No.: 555,253

[22] Filed: Nov. 8, 1995

[51] Int. Cl.⁶ ........................................................ B05C 3/02
[52] U.S. Cl. ............................................ 118/410; 118/406
[58] Field of Search ...................................... 118/410, 406, 118/419, 413; 425/461; 427/356

[56] References Cited

U.S. PATENT DOCUMENTS

| | | |
|---|---|---|
| 3,384,931 | 5/1968 | Cochran et al. . |
| 3,626,833 | 12/1971 | Koch . |
| 3,949,667 | 4/1976 | Zimmer . |
| 4,023,486 | 5/1977 | Linthicum et al. . |
| 4,622,239 | 11/1986 | Schoenthaler et al. . |
| 4,720,402 | 1/1988 | Wojcik . |
| 5,133,120 | 7/1992 | Kawakami et al. . |
| 5,183,691 | 2/1993 | Hassell et al. . |
| 5,191,709 | 3/1993 | Kawakami et al. . |
| 5,201,452 | 4/1993 | Takahashi et al. . |
| 5,234,330 | 8/1993 | Billow et al. ............................ 425/461 |
| 5,334,247 | 8/1994 | Columbus et al. ...................... 118/411 |
| 5,345,867 | 9/1994 | Schneider et al. . |
| 5,395,643 | 3/1995 | Brown et al. . |

FOREIGN PATENT DOCUMENTS

| | | |
|---|---|---|
| 166961 | 6/1989 | Japan . |
| 4147860 | 5/1992 | Japan . |

OTHER PUBLICATIONS

The Fing–Pitch Screen–Printing Process, by Gary Preeman, MPM Corp., SMT Fine Pitch (No date given).
Process Modelling Maps for Solder Paste Printing, by N. N. Ekere, E. K. Lo and S. H.Mannan, Dept. of Aeronautical and Mechanical Engineering, University of Salford, Salford, England (No date given).
A Study of the Off–Contact Screen Printing Process–Part I: Model of the Printing Process and Some Results Derived from Experiments, by Jerzy A. Owczarek and Frank L. Howland, IEEE Transaction on Components, Hybrids, and Manufacturing Technology, vol. 13, No. 2, Jun. 1990, pp. 358–367.
Parameters for Solder Paste Printing by Scott K. Buttars, Compaq Computer, Houston Texas, pp. 799–806 (No date given).
Estimation of Shear Rates During "Rolling" in the Screening and Stencilling Process, by Joseph Kevra, Central Research Labs. Alpha Metals, Inc., The International Journal for Hybrid Microelectronics, vol. 12, No. 4, Dec., 1989.
Analytical Engineering Model of the Screen Printing Process: Part I, by Dietrich E. Riemer, Solid State Technology/Aug. 1988, pp. 107–111.
Analytical Engineering Model of the Screen Printing Process, Part II, by Dietrich E. Riemer, Solid State Technology/Sep. 1988 pp. 85–90.
Screen Process Printing Techniques, Finding a Solution to Smearing and Skipping Will Effectively Resolve Registration Problems., by Mike Young, PC FAB, Feb. 1987, pp. 77–90.

*Primary Examiner*—Brenda A. Lamb
*Attorney, Agent, or Firm*—Richard D. Dixon; Roger L. May

[57] ABSTRACT

A novel apparatus for compressing viscous material through openings in a stencil is disclosed. The novel apparatus has a compression headcap which provides a contained environment to direct and to aid the flow of pressurized viscous material through the openings in the stencil. The compression headcap includes two generally parallel wiper blades that are biased into sliding communication with the stencil. Longitudinal diffuser plates guide and equalize the flow of the viscous material into the volume between two generally parallel wiper blades.

21 Claims, 6 Drawing Sheets

METHOD AND APPARATUS FOR DISPENSING VISCOUS MATERIAL

BACKGROUND OF THE INVENTION

This application is related to a commonly assigned application Ser. No. 08/363,806, filed Dec. 27, 1994, now abandoned.

1. Field of the Invention

Embodiments of the present invention relate generally to methods and devices for depositing viscous materials onto a printed wiring board. In one aspect, the present invention relates to methods and devices for compressing viscous materials, such as solder paste, through openings in a perforated substrate, such as a patterned screen or stencil.

2. Description of Related Art

Surface Mount Technology (SMT) involves placing circuit components onto circuit paths embedded on the upper surface of a printed wiring board and then soldering the components in place by a process called "reflow soldering". Before the circuit component is placed on the printed wiring board, however, it is desirable to apply solder paste to the area on the printed wiring board where the component is to be soldered into place.

Conventional methods do exist to deposit ("print") solder paste onto desired areas of a printed wiring board by forcing the paste through openings in a substrate (e.g., a stencil) placed in intimate contact with the printed wiring board.

U.S. Pat. No. 4,622,239 describes such a method and device for dispensing viscous materials. The method includes forcing a viscous material from a housing through an opening and depositing it onto a stencil between a pair of flexible members (parallel squeegee blades) which depend from the housing on either side of the opening and are in contact with the stencil. The ends of the flexible members are not connected and remain open ended. The viscous material, accordingly, is not contained within an enclosed area when it is deposited on the surface of the stencil. Movement of the housing and the flexible members horizontally across the stencil causes the trailing flexible member to force the viscous material through the openings in the stencil. U.S. Pat. No. 4,720,402 describes a similar method and device except that the leading flexible member is raised off of the stencil during movement of the housing.

U.S. Pat. Nos. 5,133,120 and 5,191,709 describe methods for filling through-holes of a printed wiring board via a mask with pressurized conductive filler material by means of a nozzle assembly unit having a nozzle tip member. The nozzle tip member, however, is designed only to dispense the pressurized conductive filler material through the mask to a single through-hole. The nozzle tip member then "scans" the printed wiring board for a second through-hole to fill. The nozzle tip member has a blunt end section which rests on the mask and a circular exit, the diameter of which may be increased or decreased by changing the nozzle tip member. The nozzle tip member dispenses the filler material without controlling unwanted flow of "excessive" filler material back through the stencil. Additionally, the nozzle tip member does not define a contained environment where "compression" of the filler material takes place through the mask followed by the immediate shearing off of the filler material within that contained environment from the surface of the stencil. In fact, the nozzle tip member itself provides no effective means for shearing off filler material from the top of the stencil, rather, after the through hole is filled and filler material "backs up" through the stencil, the nozzle tip member moves forward whereupon the "excessive" filler material is then wiped off by a separate, single, flexible squeegee member which is designed for unidirectional use only.

Unfortunately, these conventional efforts do not provide a contained environment for compression of viscous material through holes in a stencil and shearing of viscous material within the contained environment from the upper surface of the stencil. Reliance upon squeegee movement to force the viscous material, such as solder paste, through the stencil openings can lead to damage and eventual failure of both the squeegee blades and the stencil due to repeated friction. Since conventional efforts do not provide a contained environment in which compression and shearing is accomplished, waste of the viscous material is frequently encountered.

Conventional efforts, therefore, (1) fail to maximize the efficiency of printing solder paste onto a desired area of a printed wiring board and (2) fail to minimize waste of the solder paste during the printing process. A need therefore exists to develop a method for printing solder paste onto a printed wiring board and a device suitable for use therewith which overcomes the deficiencies of the conventional efforts.

U.S. Pat. No. 5,345,867 describes generally parallel, offset "doctor blades" for stripping off ink from the ink roller of a web-fed rotary printing press. Each of the doctor blades 9,8 are biased into the ink roller 2 by suitable springs 54,53 that are contained within channels 49,48, respectively. These springs function to "resiliently urge the outer ends of the blades 9 and 8 into engagement with the screened ink roller 2 at a negative contact angle" in order to assure that the blades will not be deformed or bent and that proper contact with the ink roller will be maintained. However, these blades cannot be adapted for the application of an viscous material and would not function to relieve pressure as the printhead rides unevenly across the substrate.

The present invention is directed at solving the problem of keeping the full length of the edge of the wiper or squeegee blades parallel with the stencil as the printhead travels at high speed, when the hydrodynamic pressure induced by the rolling action of the viscous material ahead of the leading edge wiper blade causes it to lift up from the surface of the stencil (much like the hydroplaning in an automobile tire tracking over a fluid covering the driving surface). Conventional solutions to this problem such as central pivot floatation of the wiper blades results in uneven pressures along the length of the wiper blades during printing, and thus uneven and possibly defective print transfer of the viscous material within the apertures in the stencil. This is contrasted with the present invention in which spring biasing forces are utilized to force the wiper blades into sliding communication with the stencil even when the hydrodynamic forces cause a lifting of the entire printhead assembly.

SUMMARY OF THE INVENTION

The present invention includes a novel apparatus and method for dispensing viscous material through openings in a stencil. Embodiments of the present invention include a process herein referred to as "compression printing" wherein pressure is applied to a viscous material within a contained environment defined by a compression headcap so as to compress it through openings in a stencil.

The apparatus of the present invention includes a reservoir containing viscous material which is operably connected to a pressure source. The reservoir is in fluid communication with a housing which terminates in an opening defined by a compression headcap formed from contiguous walls. During operation of the apparatus, two generally parallel wiper blades forming the compression headcap are biased into sliding communication with a stencil having a plurality of openings therein. The compression headcap and the stencil form a contained environment The pressure source then applies pressure against the viscous material contained in the reservoir forcing it from the reservoir into the housing and to the compression headcap. The contiguous walls of the compression headcap act to contain and to direct flow of the pressurized viscous material to the top surface of the stencil and then through the openings in the stencil. The biasing force against the wiper blades keeps them in sliding communication with the stencil, even when downward pressure induced on the viscous material being sheared off by the leading edge of the wiper blade tends to lift the compression headcap up and away from the stencil.

It is accordingly an object of the present invention to provide a novel apparatus for compressing a viscous material through openings in a stencil by means of a pressure source. It is a further object of the present invention to improve the coupling and sealing of the compression headcap with the stencil so as to equalize the printing of the viscous material onto a desired area of a printed wiring board and to minimize waste of the viscous material during the printing process.

Other objects, features or advantages of the present invention will become apparent from the following description taken in conjunction with the accompanying drawings.

BRIEF DESCRIPTION OF THE DRAWINGS

In the course of the detailed description of certain preferred embodiments to follow, reference will be made to the attached drawings, in which.

DESCRIPTION OF CERTAIN PREFERRED EMBODIMENTS

The principles of the present invention may be applied with particular advantage to obtain an apparatus for compressing a viscous material through openings in a stencil, preferred embodiments of which may be seen at FIGS. 1, 2, 3, 4, and 5 which are described more fully below.

Figure 1:
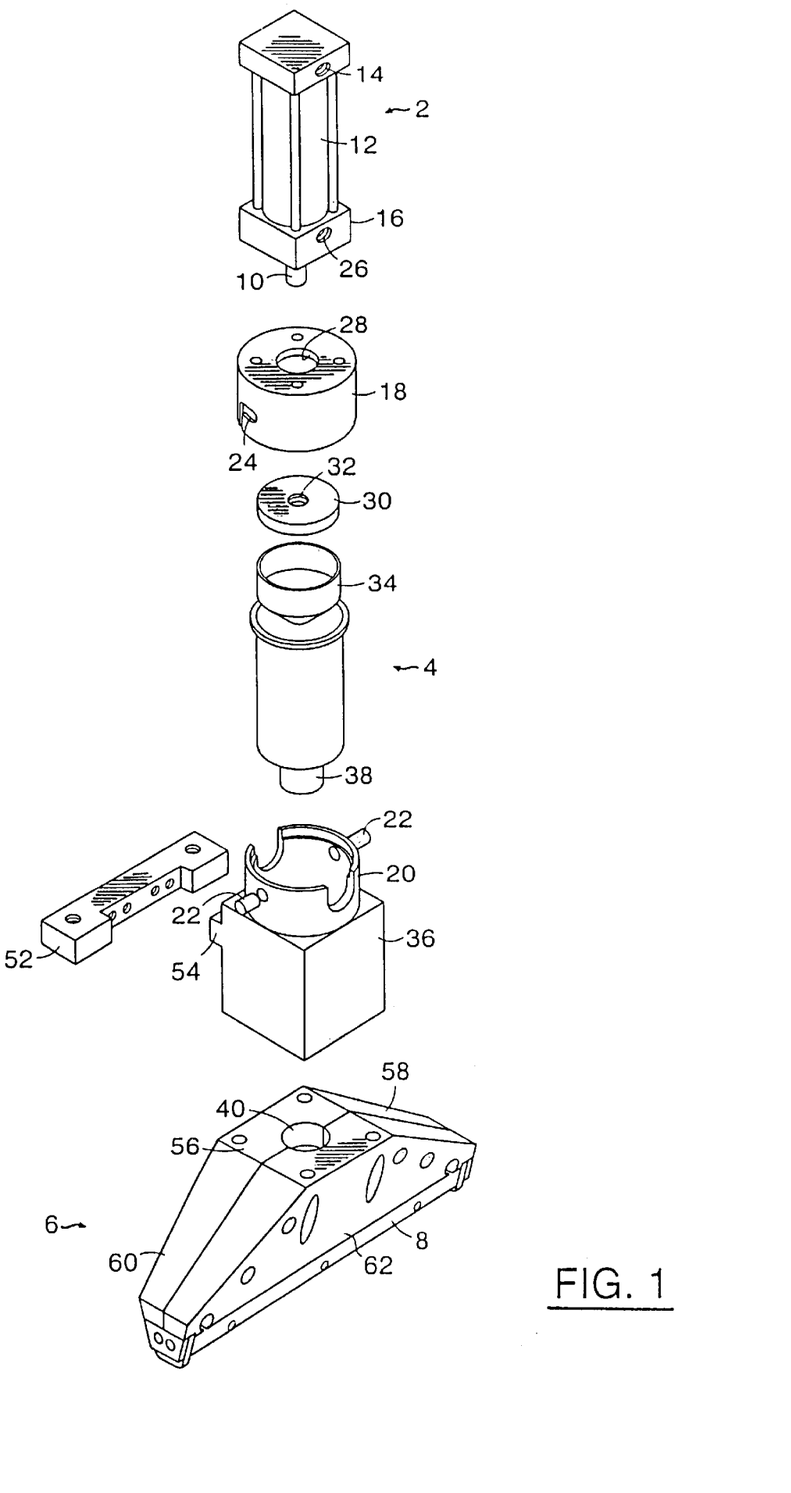
FIG. 1 is a perspective view of the apparatus of the present invention, partially exploded.

FIG. 1 is a partially exploded perspective view of one embodiment of the apparatus of the present invention. As can be generally seen at FIG. 1, the apparatus has a pressure source 2 which is operably connected to a reservoir 4 containing a supply of a viscous material, a compression head 6 and a compression headcap 8.

More particularly, FIG. 1 shows a pressure source depicted as an air cylinder 2 having a piston (not shown) connected to a rod 10 contained in a cylinder housing 12. Pressure inlet 14 allows for the introduction of air pressure at the top of air cylinder 2 thereby displacing the piston causing piston rod 10 to move downward. The air cylinder 2 is mounted via base 16 to cylinder mount 18 which in turn is removably mounted to casing 20 via a twist socket connector having posts 22 and socket grooves, one of which is shown at 24. Base 16 has air inlet 26 for the introduction of air pressure at the bottom of air cylinder 2 thereby displacing the piston causing piston rod 10 to move upward.

Piston rod 10 extends through opening 28 of cylinder mount 18 and is fixedly connected to syringe pusher 30 at contact 32 which in turn engages displacement piece 34 which is movably disposed within syringe 4 which contains a viscous material. Displacement piece 34 acts as a plunger and is designed to mate with the interior of syringe 4 to ensure effective displacement of viscous material with minimal waste. Pressure source 2 is designed to mechanically meter out viscous material through operation of the syringe pusher 30 on the displacement piece 34. The syringe pusher 30, displacement piece 34 and syringe 4 are all vertically housed in operative fashion within the cylinder mount 18, the casing 20 and the syringe housing 36.

The vertical arrangement of the pressure source 2 and the syringe 4 containing the viscous material is a preferred arrangement which advantageously provides for even and direct pressure in metering out the viscous material onto the top surface of a stencil. It is to be understood that pressure source 2 is not limited to an air cylinder of the type depicted in FIG. 1, but that other suitable pressure sources may be used by one of ordinary skill in the art based upon the teachings of the present invention. Such pressure sources include those which mechanically, electrically, or hydraulically operate a mechanical force, such as a piston rod and displacement piece, to meter out viscous material from a syringe housing or other reservoir which contains viscous material. In addition, pneumatic pressure may be used directly to force viscous material from a reservoir housing. Also, pressure source and reservoir configurations other than the vertical configuration depicted in FIG. 1 are useful in the present invention. Such configurations include side mounted reservoirs and pressure sources or other configurations readily known to those skilled in the art.

The syringe 4 is preferably a disposable unit which can be replaced when desired by disconnecting cylinder mount 18 from casing 20 via the twist socket connector, removing the syringe and replacing it with an alternate syringe. Examples of disposable syringes useful within the teachings of the present invention include those which are readily commercially available from Methods Engineering, Vauxhall, N.J. The cartridges may be purchased prefilled with suitable viscous materials or they may be purchased empty and then filled with suitable viscous materials, such as solder pastes, which are useful within the practice of the present invention. Useful solder pastes may be readily commercially available from Alpha Metals, Jersey City, N.J.

Typical solder pastes useful with surface mount technology generally contain an alloy of tin, lead and silver in various proportions in combination with other useful solder paste metals, viscosity agents, flux and/or solvents depending upon the desired use of the solder paste. Solder pastes useful in the present invention will become apparent to one of ordinary skill in the art based upon the teachings herein.

Figure 2:
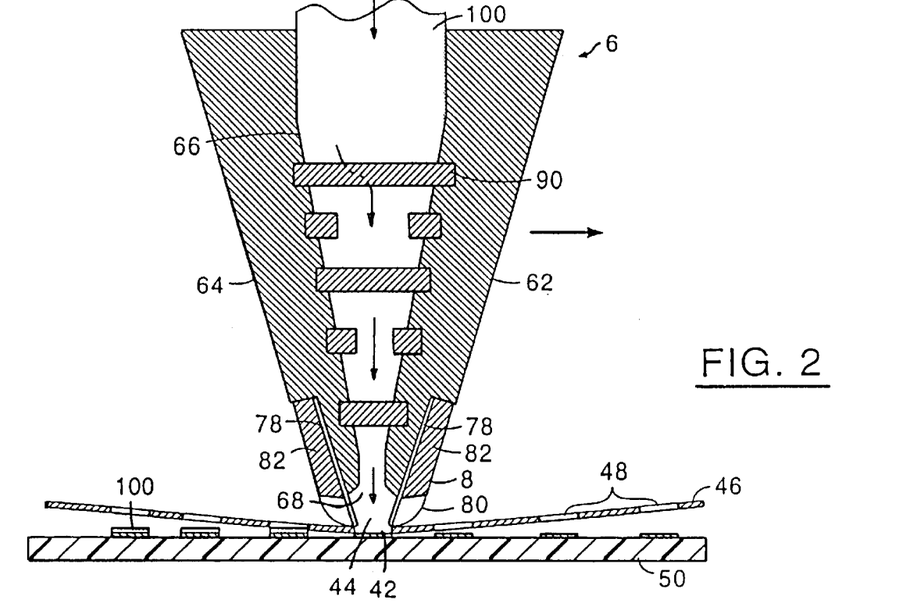
FIG. 2 is a side cross-sectional view of a compression head, a compression headcap, a stencil and a printed wiring board of the present invention showing movement of the solder paste through the compression head, the compression headcap and the openings of the stencil onto the printed wiring board.

The syringe housing 36 is mounted to a housing referred to herein as a compression head generally depicted at 6 in FIG. 1 and shown in a cross-sectional side view in FIG. 2. The syringe 4 has flange opening 38 which is inserted into and mates with first opening 40 of compression head 6 which is described hereafter with reference to both FIGS. 1 and 2 and FIG. 3 which is a bottom perspective view of the compression headcap 8, partially broken away. The compression head 6 terminates in a substantially uniform second opening 42 which is defined by compression headcap 8. The compression headcap 8 is formed from contiguous walls which define a volume 44 within compression headcap 8. The contiguous walls may be either unitary or formed from separate elements and are designed to contact stencil 46 to provide a uniform and substantially flush union with stencil 46 at the point of contact. As can be seen in FIG. 2, stencil 46 has openings 48 and is placed in an operable relationship with a printed wiring board 50. The stencil 46 may be placed in intimate contact with printed wiring board 50 or, as shown in FIG. 2, it may be placed a distance above printed wiring board 50 such that pressure from the compression head 6 forces the stencil 46 into contact with printed wiring board 50. Although stencil 46 is shown in cross-section, it is to be understood that openings 48 may have any desired orientation on stencil 46. Further openings 48 may differ in size depending upon the area of the printed wiring board 50 to be printed with the viscous material. The compression headcap 8 and stencil 46 together form a contained environment 44 for the viscous material during operation of the apparatus of the present invention.

As can be seen in FIG. 1, cross bar mount 52 is attached to syringe housing 36 via flange 54. Cross bar mount 52 is also attached to a mechanism (not shown) for horizontally displacing the apparatus of the present invention along the stencil 46.

The compression head 6 is preferably formed from metal, such as iron or stainless steel or other material suitable for use with pressurized viscous material. The compression head 6 has top surface 56 which serves as the base to which the syringe housing 36 is attached. Side surfaces 58 and 60 extending from top surface 56 slope away from each other as depicted in FIG. 1 to define an increasing length of compression head 6. Front and back surfaces 62 and 64 are contiguous with side surfaces 58 and 60 and slope toward each other as depicted in FIG. 2 to define a decreasing width of compression head 6. The side surfaces join with the front and back surfaces to define a tapered interior chamber 66 as shown in FIG. 2 which acts to restrict flow of viscous material through compression head 6. Interior chamber 66 terminates in generally rectangular exit 68. Compression head 6 preferably acts as a nozzle to direct and constrict the flow of viscous material through generally rectangular exit 68. The compression headcap 6 defines a volume 44 surrounding the rectangular exit 68 and into which viscous material flows after exiting the interior chamber 66 of compression head 6. As shown in FIG. 2, the volume 44 is preferably a separate chamber into which the viscous material flows after exiting the interior chamber 66 via rectangular exit 68. The compression headcap 8 defines a generally rectangular opening 42 which is to be contacted with stencil 48. The compression headcap 8 acts to contain and direct the flow of viscous material to the stencil 46. In an alternate embodiment, it is to be understood that the interior chamber 66 may terminate directly into compression headcap 8 without the need for rectangular exit 68 or volume 44.

Figure 3:
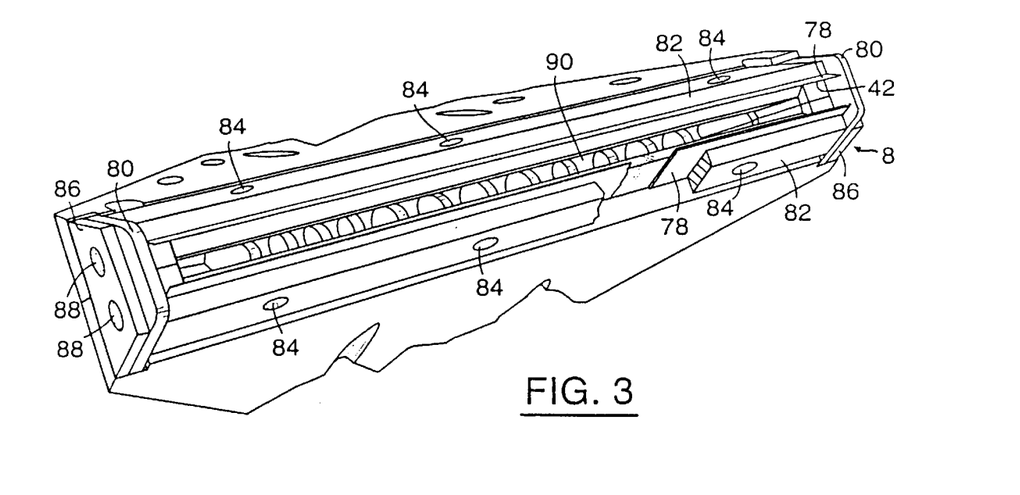
FIG. 3 is a bottom perspective view of the compression headcap of the present invention, partially broken away.
Figure 4:
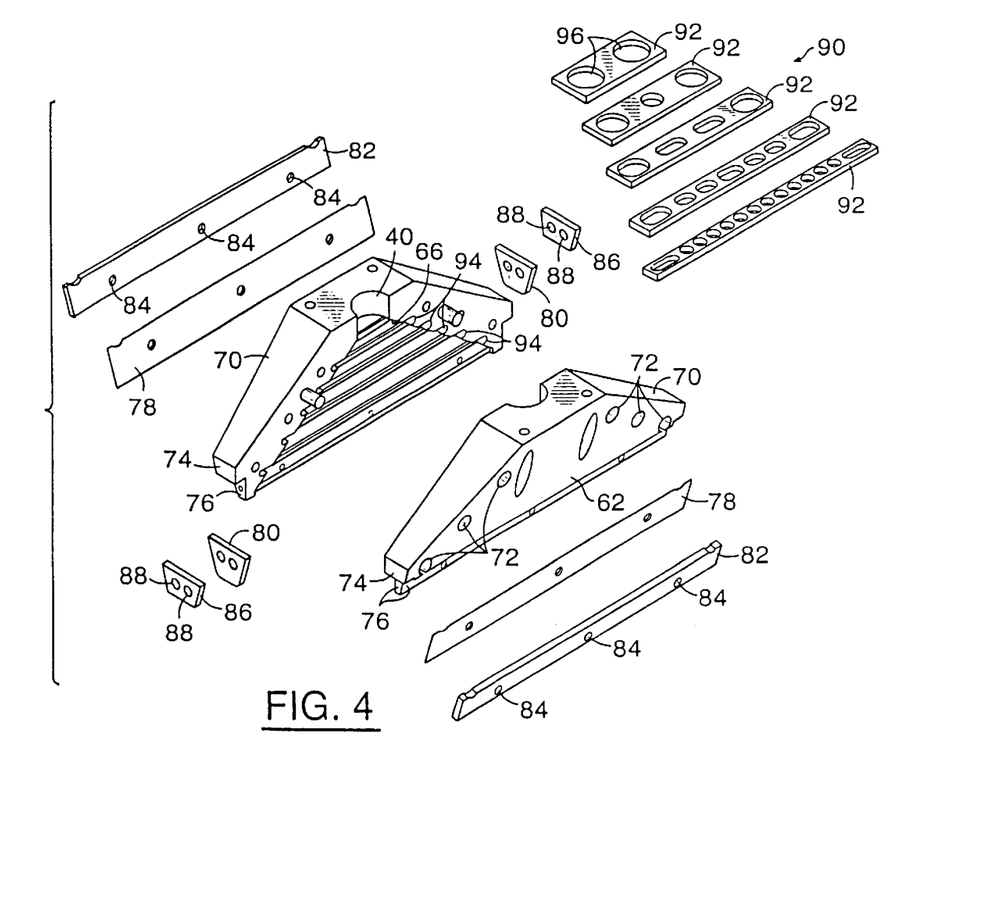
FIG. 4 is an exploded perspective view of the compression head of the present invention showing components of the compression headcap and one embodiment of a diffuser of the present invention.

As can be seen In FIG. 4, the compression head 6 has two half sections 70 which are fixedly connected by screws (not shown) via screw holes 72. The bottom side section 74 of each half section 70 is provided with ledge area 76 to engage the compression headcap 8. As depicted in FIGS. 2, 3 and 4, compression headcap 8 has rectangular blades 78 and end caps 80, which define generally rectangular opening 42. Blades 78 are each fixedly mounted to a corresponding ledge area 76 of front surface 62 and back surface 64, respectively, by means of corresponding rectangular blade holders 82 and screws (not shown) via screw holes 84. Blades 78 each extend along substantially the entire length of corresponding ledge area 76. End caps 80 are attached to a corresponding ledge area 76 of bottom side section 74 via corresponding cap mounts 86 and screws (not shown) via screw holes 88. The end caps 80 are contiguous with blades 78 and together form the compression headcap 8. As can be seen more clearly in FIG. 2, blades 78 parallel the slope of corresponding front and back surfaces 62 and 64, and are, therefore, seen to be angled inward relative to the interior chamber 66 of compression head 8.

Blades 78 are preferably thin and formed from rigid material such as iron or stainless steel. End caps 80 are preferably formed from a flexible substance such as polyurethane to avoid damage to the stencil during operation of the apparatus of the present invention. Cap mounts 86 and blade holders 82 are formed from any solid material capable of securing the corresponding end cap or blade.

While the compression headcap 8 is depicted in FIGS. 2, 3, and 4 as being formed from integral parts, it is to be understood that compression headcaps having a unitary structure are within the teachings of the present invention. Such unitary compression headcaps are formed from a single rectangular shaped unit and are designed to encircle the ledge area 76 of the compression head 6 or otherwise operatively engage compression head 6. Such compression headcaps may be either fixed or removably mounted to the compression head and may have various sizes of opening 42.

The compression head 6 and compression headcap 8, in combination with the pressure source 2 and syringe 4 advantageously provide a vertical down force to move the viscous material evenly and directly to the stencil. The compression headcap 8 of the present invention advantageously provides a contained environment to direct and to aid in the extruding of pressurized viscous material through openings in the stencil. The extruded viscous material is then deposited on the pattern of the printed wiring board. The apparatus of the present invention provides for very high speed printing capability while maintaining print definition and reduced cycle time. Waste of viscous material is minimized due to the contained environment provided by the compression headcap 8. The length of the compression headcap 8 allows for simultaneous compression printing through a plurality of openings 48 in stencil 46. Furthermore, the trailing blade 78 relative to the direction of operation advantageously operates to shear off the viscous material contacting the stencil within the compression headcap 8 when the apparatus of the present invention is horizontally disposed across the stencil. The blades 78 are rigid and angled to advantageously achieve a smooth shearing of the viscous material. The compression head 6 and compression headcap 8 are advantageously rectangular in shape so that they may operate over a significant area of the stencil with each pass. Additionally, given the dual blade design of the compression headcap 8, the apparatus of the present invention may operate in both the forward and reverse directions thereby improving the efficiency of the compression printing process of the present invention.

As can be further seen in FIGS. 2 and 4, compression head 6 has diffuser 90 which is fixedly mounted within interior chamber 66. Diffuser 90 has a plurality of diffuser plates 92 which are horizontally disposed within interior chamber 66 via grooves 94. Each diffuser plate 92 has a series of openings 96 through which viscous material is to flow. Each opening 96 may be either circular or oblong and decreases in average size as the diffuser plates progress from the first opening 40 to the compression headcap 8. The openings 96 also increase in number as the diffuser plates progress from the first opening 40 to the compression headcap 8. The diffuser 90 advantageously serves to break up the flow of viscous material and evenly and uniformly distribute it from side to side of the rectangular exit 42. The diffuser 90 may also serve to reduce the velocity of the viscous material flowing through the compression head and increase the static pressure of the viscous material which aids in the compression printing process.

Figure 5:
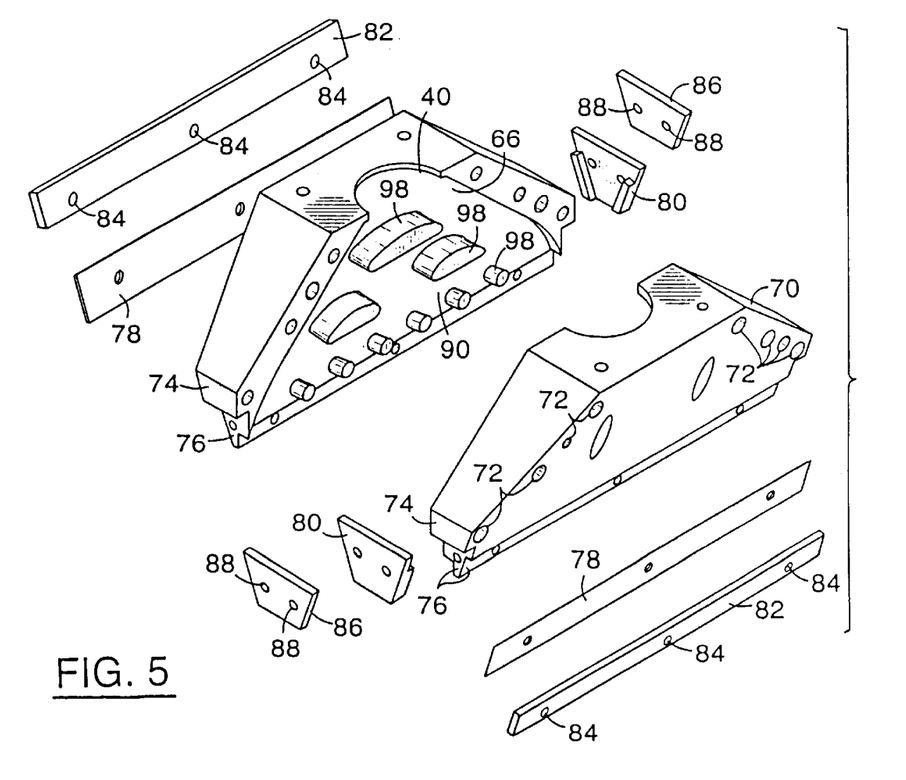
FIG. 5 is an exploded perspective view of the compression head of the present invention showing components of the compression headcap and a second embodiment of a diffuser of the present invention.

FIG. 5 shows an alternate embodiment of a diffuser 90 useful in the present invention. The diffuser 90 has a plurality of diffuser islands 98 which are horizontally disposed in rows within interior chamber 66. The diffuser islands 98 may be fixedly installed within the interior chamber 66 or they may be molded directly within the interior chamber 66. As with the diffuser 90 of FIG. 4, each diffuser island 98 acts to break up the flow of the viscous material and uniformly and evenly distribute it from side to side of rectangular exit 42. The diffuser islands may be either circular or oblong and decrease in average size as the rows progress from the first opening 40 to the compression headcap 8. The diffuser islands 98 also increase in number as the rows progress from the first opening 40 to the compression headcap 8. The diffuser islands 98 of the present invention are advantageous in that they provide for ease of fabrication of the compression head and ease of cleaning.

Operation of the apparatus of the present invention is now described as follows with reference to FIGS. 1 and 2. When compression printing according to the teachings of the present invention, the compression headcap 8 of the apparatus of the present invention is brought into contact with the top surface of stencil 46 which forces the stencil downward until it is in intimate contact with the printed wiring board below as shown in FIG. 2. The apparatus is then moved in a horizontal direction, as shown in FIG. 2, across the stencil 46.

During movement of the stencil, pressure source 2 acts on syringe 4 to force viscous material 100 from the syringe 4 into the interior chamber 66 of compression head 6 where it is diffused by diffuser 90 and directed to rectangular exit 68. The viscous material then enters volume 44 of compression headcap 8 which provides a contained environment via blades 78 and end caps 80 to direct the pressurized viscous material under pressure to the top surface of stencil 46. The viscous material is then extruded through openings 48 in the stencil 46 over which the compression headcap 8 travels. The extruded viscous material 100 is thereby printed on the printed wiring board 50. Movement of the compression headcap 8 across the stencil surface causes the trailing blade 78 which is angled inwardly relative to the interior chamber 66 to shear off the viscous material from the top surface of stencil 46. Once the apparatus has traversed the length of the stencil, the apparatus may simply reverse its direction and continue the compression printing process since the compression headcap 8 has dual blades 78 to accomplish the shearing process in either direction of movement.

Operating variables of the apparatus of the present invention, such as run speed and pressure, may be adjusted to accommodate either viscous materials having a wide range of viscosities or stencils with holes having a wide range of diameters. The following data in Table 1 is representative of the parameters at which the apparatus has successfully operated. Print speed is measures in inches per second, air pressure is measured in pounds per square inch, viscosity of the solder paste is measured in centipoises per second, stencil apertures are measured in inches, and the particle sizes of the solder pastes used are between 10–37 microns.

TABLE 1

| Print Speed (inches/sec.) | | Air Pressure | Viscosity (cps) | | Aperture (inches) | |
|---|---|---|---|---|---|---|
| Low | High | (psi) | Low | High | Low | High |
| 0.94 | 1.26 | 20 | 850K | 1.0M | 0.0055 | >0.025 |
| 1.45 | 1.70 | 20 | 850K | 1.0M | 0.0055 | >0.025 |
| 2.27 | 2.31 | 20 | 850K | 1.0M | 0.0055 | >0.025 |
| 3.10 | 3.89 | 30 | 850K | 1.0M | 0.0055 | >0.025 |
| 4.20 | 4.77 | 30 | 850k | 1.0M | 0.0055 | >0.025 |
| 5.98 | 6.62 | 40–50 | 850K | 1.0M | 0.0075 | >0.025 |
| 6.69 | 7.23 | 50–60 | 850K | 1.0M | 0.0075 | >0.025 |
| 7.70 | 8.00 | 50–60 | 850K | 1.0M | 0.0075 | >0.025 |

As indicated by the above data, the apparatus of the present invention successfully operated over a wide range of print speeds, air pressures and stencil openings. The compression printing method disclosed herein advantageously provides for quicker print speeds, better quality of printing, and less waste of solder paste material than is encountered with conventional printing methods. A maximum print speed of 8 inches per second was achievable. It is noted, however, that for print speed in excess of 4.77 inches per second, increased air pressure was required in order to maintain acceptable print quality. This increased use of pressure produces two undesirable effects which was resolved in the second embodiment. These effects were: 1) Increases in pressure for improved print speeds caused an excessive back pressure to be imparted on the squeegee head. This back pressure lifted the non-compliant blades of the first embodiment above the surface of the stencil resulting in paste being left on the stencil. Excess pressures (above 60 psi) further lifted the head due to back pressure such that poor print depositions occurred. In essence, the process window for the first embodiment was significantly more narrow than that of the second embodiment. 2) Excessive pressures may exceed the tension force of the stencil. If this occurs, deformation of the stencil may result making it un-useable. For this reason, the lowest air pressure is desirable.

SECOND EMBODIMENT OF THE COMPRESSION HEAD

A second embodiment of the compression headcap will now be described with reference to FIGS. 6–11. Specific parts in the new compression headcap have been redesigned in order to provide higher through-put operation, more consistent coatings and reduced waste from the solder paste deposition process.

Figure 6:
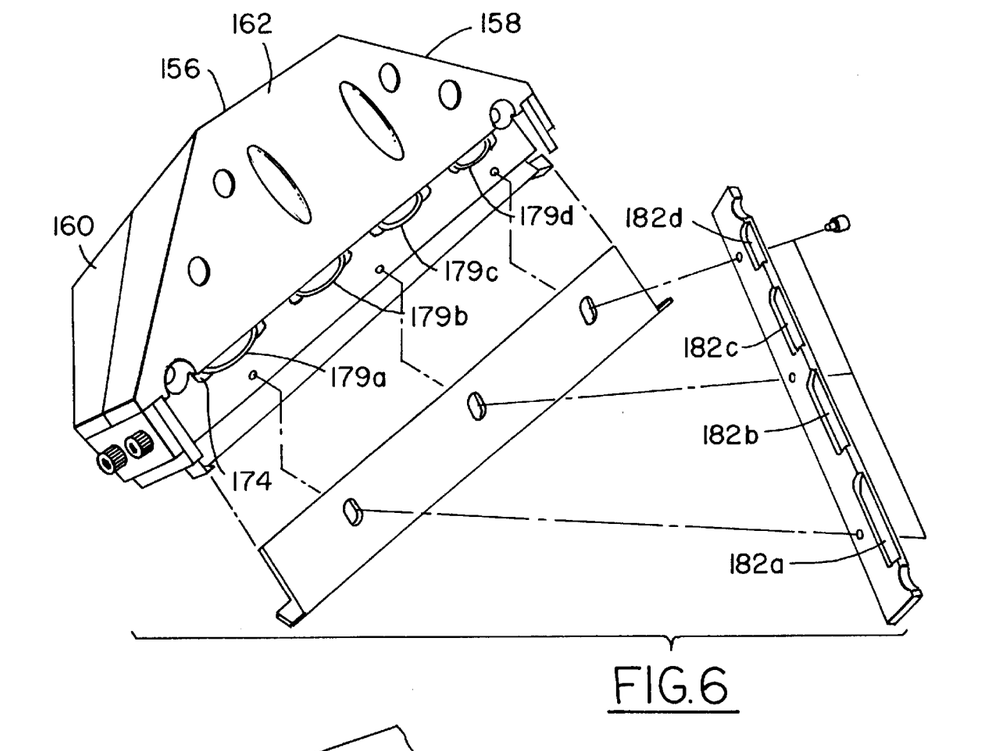
FIG. 6 is a partially exploded perspective view of a second embodiment of the compression headcap that includes a pair of self-leveling squeegee blades.
Figure 9:
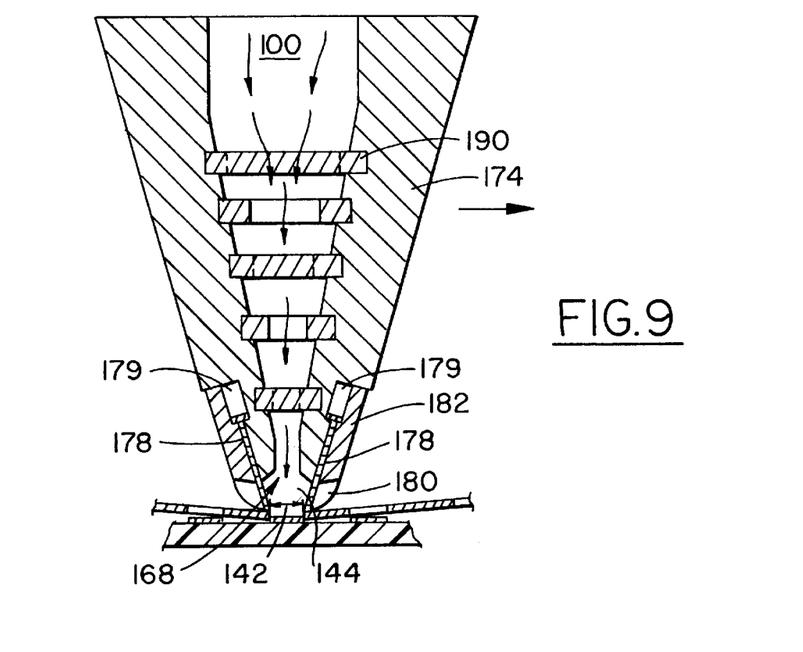
FIG. 9 is a side cross-sectional view of the second embodiment of the compression head, the compression headcap, a stencil and a printed wiring board in accordance with the second embodiment of the present invention showing movement of the solder paste through the compression head, the compression headcap and the opening of the stencil onto the printed wiring board.

Except as specified hereafter, the second preferred embodiment of the compression head 106 includes the same parts as the original design for compression head 6. Parts having similar function will be defined by the same reference numerals as previously used in FIGS. 1–5, except that the new compression headcap design will have the reference numerals incremented by 100. As shown in FIGS. 6 and 9, the new compression head 106 contains corresponding elements such as the top surface 156, the side surfaces 158 and 160, the front and back surfaces 162 and 164 (hidden), and a tapered interior chamber 166 that terminates in a generally rectangular exit 168. The rectangular exit 168 opens into a tip volume 144 that is defined generally by the rectangular blades 178 on the sides, and the rectangular opening 142 at the bottom. As will be apparent from the subsequent explanation, the size of the rectangular opening 142 will vary depending upon the vertical displacement of the rectangular blades 178 as they ride across the stencil 46.

In order for the solder paste 100 to be uniformly deposited in the apertures 48 within the stencil 46 and onto the substrate 50 at a high speed, it is necessary for the rectangular wiper or squeegee blades 178 to maintain uniform spacing from the upper surface of the stencil 46 under all conditions. Experimental tests have shown that irregularities in the planar surface of the stencil 46, bending moments, slight irregularities in the substrate 50 and excessive back pressure of the solder paste 100 against the stencil 46 can cause gaps between the distended ends of the rectangular wiper blades 178 and the stencil 46 periodically during the process The effect produced by excessive back pressure of the solder paste 100 against the stencil 46 occurs at high speeds where the pressure of the pusher 34 within the syringe 4 must be increased to inject sufficient solder paste 100 so as to fill the apertures 48 within the stencil 46. When this pressure exerted on the solder paste 100 exceeds the pressure of the printhead and the rectangular squeegee blades 178 downwardly onto the stencil 46, then the resulting back pressure tends to lift the entire compression head 106 away from the stencil 46. Downward pressure on the compression head 106 cannot be increased further because this pressure may stretch the stencil 46 which may be permanently deformed. This lifting of the compression head 106 also can cause leakage of the solder paste 100 and loss of contact between the rectangular squeegee blades and the stencil.

Figure 7:
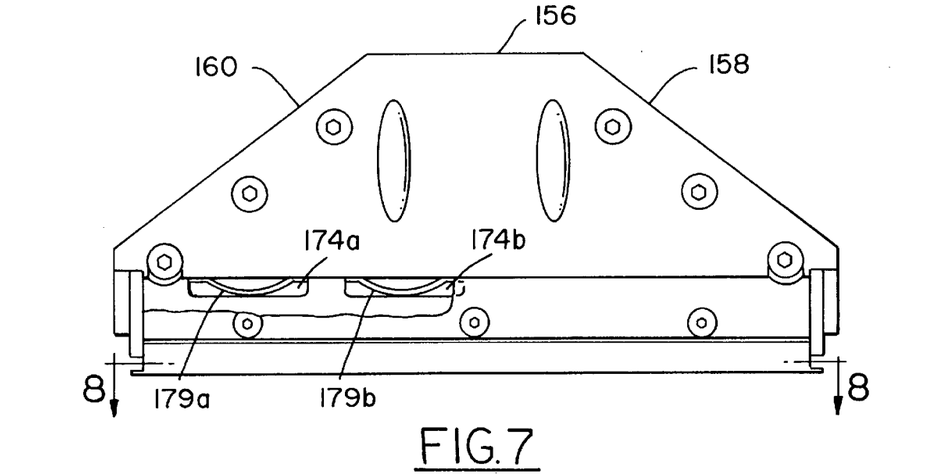
FIG. 7 is a frontal view of the compression head shown in FIG. 6 illustrating the location of the leaf springs.

The second preferred embodiment of the compression head 106 addresses this operational problem by providing a series of leaf springs 179a, b, c, and d which are more clearly illustrated in FIGS. 6, 7 and 9. With specific reference to FIG. 6, the leaf spring 179a is contained within a channel formed by a first half 174a in the bottom side section 174 of the compression head 106 and another similar channel 182a in the rectangular blade holder 182. As illustrated in FIGS. 6 and 9, the upper edge of the rectangular blade 178 rests upon and compresses the four leaf springs 179a, b, c and d. The compression force serves to bias the rectangular wiper blade 178 into close communication with the stencil 46. In this manner, if a portion of the stencil is not flat or in some other manner is deformed, the biasing force produced by the leaf springs 179a, b, c and d will cause the distended edge of the rectangular wiper blades 178 to closely track the upper surface of the stencil 46, notwithstanding such surface defect. Furthermore, the downward pressure on the compression head 106 now may be increased to overcome the back pressure exerted by the solder paste 100 without damaging the stencil. The additional down pressure on the compression head 106 is compensated by the biasing forces of the springs 179 as they allow the compression head 106 to "float" over the stencil 46 without losing contact as before. Thus, higher relative printing speeds may be maintained with improved quality levels, such as reduced bridging between adjacent but separated deposits of solder paste.

This close tracking of the upper surface of the stencil 46 by the distended end of the rectangular blade 178 allows the speed of the process to be increased substantially while at the same time improving the quality and consistency of the solder paste 100 deposited within the apertures 48 inside the stencil 46. For example, the conventional dual squeegee method for depositing the solder paste into apertures 48 within the stencil 46 operates at a linear speed of only about 2 inches per second, and in a production mode produces typical defects on the order of 480–485 parts per million. The compression head 6 illustrated in FIGS. 1, 2, 3 and 4 operates at a faster 3–4 inches per second, and yet products typical defects on the order of 95–100 parts per million. The improved compression head 106 as illustrated in FIGS. 6 through 11 is capable of operating at a linear speed of 6 inches per second (or greater), and yet produces typical defects on the order of only 11 parts per million. This increase in speed and quality levels results, at least in part, from a reduction in pressure on the compression head 106 to less than 12 pounds (29 to 30 pounds per square inch for two blades over the maximum range of travel (0.090")) as compared to 25–30 pounds for the compression head 6 and more than 30 pounds pressure for prior art devices.

When translated into throughput capabilities (as measured by test boards per hour, with zero bridging defects), the improved compression head 106 is capable of approximately 240 test boards per hour as compared to approximately 150 boards per hour for the compression head 6 and only about 90 boards per hour for the prior art flexible blade devices. The improvements in deposition uniformity (as defined by the standard deviation of the weight of solder deposited per area) is improved over the baseline provided by the flexible blade devices of the prior art by about 102% for the compression head 6 and by about 114% for the compression head 106. Estimated wasted solder paste per 300 gram syringe is reduced from approximately 75–100 grams for the flexible blade devices of the prior art, to approximately 50–75 grams for the compression head 6, and to only about 25 grams or less for the improved compression head 106.

These productivity and quality improvements are achieved even though the improved compression head 106 system is less expensive to manufacture because no complex equipment or processing is required to level the printhead prior to the printing process.

While the preferred embodiment of the improved compression head 106 utilizes leaf springs, it will be apparent that coiled springs or other similar mechanisms capable of providing a biasing force on the upper end of the rectangular blades 178 may also be used. While mechanical springs have been illustrated, the biasing force could also be exerted through hydraulic, pneumatic, hydrostatic or other similar means. The leaf springs 178 are manufactured from 0.010 inch thick spring steel that is approximately 0.1 inches to 0.25 inches in width. The shape and construction of the leaf springs 179a, b, c and d provide a biasing force of approximately 10 pounds to 12 pounds of pressure exerted upon the upper edge of the rectangular blade 178 for forcing the lower distended edge thereof into sliding communication with the stencil 46. For 0.040"–0.045" deflection (the normal operating range) to 0.090" (maximum deflection), the biasing force measured approximately 10.9 psi. The direction of the biasing force is generally parallel to the plane of the rectangular wiper blade 178 to force it into closer communication with the stencil 46. It will be apparent to one skilled in the art that these materials, measurements and pressures are listed as examples, and this embodiment could be easily adapt for enlarging the size of the compression head 106, increasing the speed of movement, etc.

It should be apparent from FIG. 9 and the above description that as the rectangular wiper blades 178 cause a vertical movement and compression of the leaf springs 179a, b, c and d, the width of the rectangular opening 144 will vary. When both the leading and trailing rectangular wiper blades 178 are displaced in the vertical direction to compress the leaf springs 179, the rectangular opening 142 will increase slightly in width.

Figure 8:
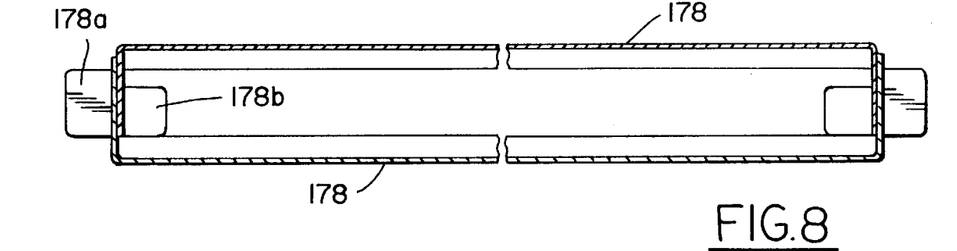
FIG. 8 is a top perspective view of the self-leveling squeegee blades taken along section lines 8—8 in FIG. 7.
Figures 10, 11:
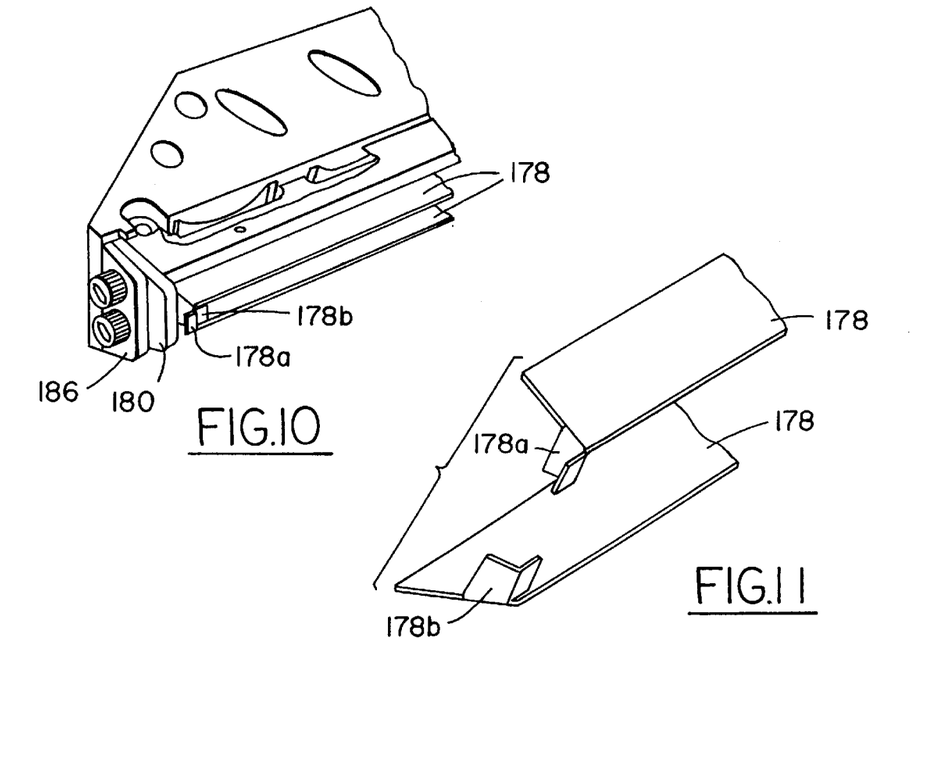
FIG. 10 is a bottom perspective view of the second embodiment of the compression head illustrating the location of the leaf springs and the integral end caps attached to the self-leveling blades.
FIG. 11 is a bottom perspective exploded view illustrating the integral, overlapping end caps attached to the ends of the self-level squeegee blades.

As illustrated in FIGS. 8, 10 and 11, cooperating integral end caps 178a and 178b are located at the longitudinal ends of the rectangular blades 178 adjacent the end cap 180. The cooperating integral end caps 178a and 178b have vertically oriented sections that slidingly overlap each other as the width of the rectangular opening 142 changes. Therefore, the viscous material 100 will be held within the tip volume 144 by the overlapping surface produced by the cooperating integral end caps 178a and 178b, in cooperation with the end cap 180 and the end cap mounts 186.

The cooperating integral end caps 178a and 178b also include horizontally disposed pads that, while not overlapping, provide additional sealing impediments to the flow of the viscous material 100 from the ends of the rectangular opening 184. During operation, the cooperating integral end caps 178a and 178b substantially eliminate mounds of viscous material that can appear at the longitudinal ends of the compression head 106. By eliminating these wasteful mounds, the expensive viscous material can be conserved and additional cleaning steps for the substrates and the stencil are not required.

Except for the above described mechanical changes in the second preferred embodiment of the compression head 106 and cap 108, the remainder of the method and apparatus for dispensing viscous material operates in according with the first preferred embodiment of the invention.

Figure 12:
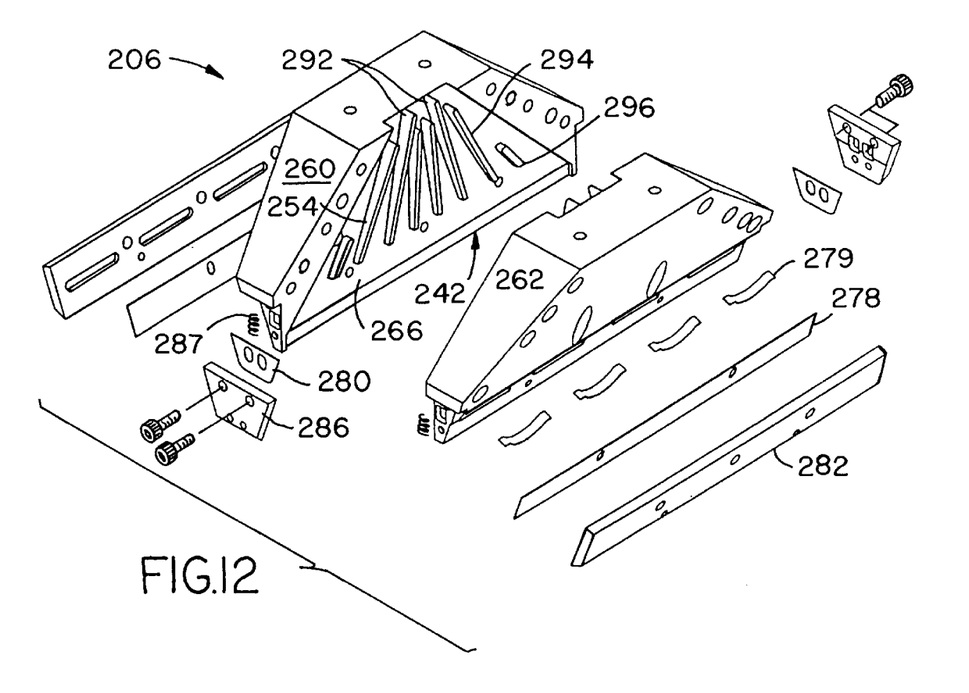
FIG. 12 is an exploded perspective view of the second embodiment of the compression head, including a third embodiment of the diffuser plates having a vertical channel orientation.

With reference to FIG. 12, a third preferred embodiment of the compression head 206 is illustrated as including a plurality of diffuser plates 290 that are vertically disposed within the interior chamber 266. The plurality of diffuser plates 290 include two major diffuser plates 292 and four minor diffuser plates 294. Two subminor diffuser plates 296 are also included adjacent the lower portion of the interior chamber 266. These diffuser plates 290 serve to break up and redistribute the flow of the viscous material in order to evenly and uniformly present the material from side to side across the rectangular exit 242, while also serving to equalize the pressure of the viscous material flowing out of the rectangular opening 242.

The length, angular separation and relative separation between the plurality of diffuser plates 290 have been designed to provide the optimum balance between breaking up the flow of the viscous material and evenly distributing it throughout the entire cross section of the rectangular exit 242.

It should be apparent from FIG. 12 that both the left section 260 and the right section 262 of the compression head 206 include a plurality of diffuser plates 290. In this embodiment, the major diffuser plates 292 in the visible left section 260 align precisely with corresponding major diffusion plates 292 in the hidden half of the right section 262 of the compression head 206. In a similar manner, the minor diffusion plates 294 and the subminor diffusion plates 296 align with corresponding diffuser plates in the hidden right section 262 of the compression head 206. Under certain conditions it may be desirable to utilize diffuser plates of different lengths, different orientations and different non-corresponding alignments in the two sections of the compression head 206 in order to provide additional mixing and to improve the uniformity of the viscous material as required by the specific application.

The vertical diffusion plates 290 are canted from the vertical direction by approximate angles of 6.5° for the first minor diffusion plate 294 closest to the centerline, 19.5° for the major diffusion plate 292, 33.5° for the second minor diffusion plate 294, and 44.5° for the subminor diffusion plate 296.

The vertical channel design uses optimized streamwise vanes to guide the paste flow through the divergent compression printing head. The spread angles between diffuser plates 290 and the length of individual diffuser plates are analytically determined through computational fluid dynamics (CFD) technique so that the viscous material distributes evenly at the exit of the printing head.

The new design results in a pressure drop reduction of about 21 pounds per square inch (from 91 to 70 pounds per square inch) to deliver the same volume of viscous material flow rate when compared with the previous design shown in FIGS. 1 through 5. Moreover, the undesired wakes behind the blockages of the old design are completely eliminated. This results in a uniform flow distribution at the head exit.

The diffuser plates 290 equalize the velocity distribution of the viscous material at the exit and improve the pressure recovery. Since the divergent angle of the compression head is very large, it always gives rise to an undesired "stalled" condition in the diffuser. Instead of a uniform velocity distribution of the viscous material, the flow may form a jet-like pattern throughout the diffuser. The vertical channels subdivide the single large divergent passage into several smaller channels with much smaller opening angles to eliminate the flow stall. The velocity of the viscous material is always higher in the central region than that in the vicinity of the walls. It is essential that the geometrical configuration of the diffuser plates guide appropriate viscous material flow rates into each individual channel such that a uniform velocity distribution is attained at the exit. Consequently, channel width is relatively narrower near the center and wider near the extremities. Moreover, for the passage away from the centerline, the divergent angle is not symmetric. This will create a biased flow of the viscous material toward the center. Two subminor diffuser plates 296 are located near the exit of the two sidewall channels to correct this undesired effect. The vertical channels defined by the diffuser plates 290 result in a reduction of the back pressure of about 24% on the flow of the viscous fluid 100 through the compression head 206.

It is to be understood that the embodiments of the invention which have been described are merely illustrative of some applications of the principles of the invention. Numerous modifications may be made by those skilled in the art without departing from the true spirit and scope of the invention

What is claimed is:

1. An apparatus for compressing a viscous material through openings in a stencil, comprising:

a reservoir containing a supply of the viscous material;

a pressure source operably connected to said reservoir whereby pressure is applied to the supply of viscous material;

a housing having a first opening in fluid communication with said reservoir and having a compression headcap formed from contiguous walls of said housing and a pair of wiping blades forming a V-shaped neck for defining a second opening for expelling the viscous material under pressure into openings in the stencil, and means for biasing each of said wiping blades into sliding communication over the stencil, wherein the size of said second opening changes as said wiping blades are displaced against said biasing means.

2. The apparatus of claim 1 wherein shearing edges of said wiping blades are linearly aligned substantially parallel to each other.

3. The apparatus of claim 1 wherein opposing ends of said wiping blades include juxtaposed integral caps for slidingly engaging each other to seal end sections of said second opening.

4. The apparatus of claim 1 wherein said biasing means comprise springs operatively interposed between each of said wiping blades and said housing.

5. The apparatus of claim 4 wherein said springs comprise leaf springs.

6. The apparatus of claim 4 wherein said springs exert a biasing force generally parallel to the plane of said wiping blade.

7. The apparatus of claim 1 wherein the force produced by said biasing means effectively offsets a portion of the backpressure produced by the viscous material acting against the stencil.

8. An apparatus for compressing reflow solder material through openings in a stencil, comprising:

a reservoir containing a supply of reflow solder material;

a pressure source operably connected to said reservoir, whereby pressure is applied to the supply of reflow solder material;

a housing having a first opening in fluid communication with said reservoir and a substantially rectangular second opening defined by two wiper blades juxtaposed to form a V-shaped neck defining said second opening at the distended end thereof and through which the reflow solder material is inserted under pressure into the opening in the stencil; and means for biasing each of said wiper blades into sliding communication with the stencil such that said second opening increases in size as said housing is compressed against the stencil.

9. The apparatus of claim 8 wherein said biasing means comprise springs for exerting biasing forces along the length of said wiper blades for leveling the sliding communication between said wiper blades and the stencil.

10. The apparatus of claim 9 wherein said biasing means comprise a plurality of leaf springs operatively coupled between said housing and said wiper blades.

11. The apparatus of claim 9 wherein said biasing means exerts a force on said wiper blades for shearing excess viscous material from the stencil adjacent the openings therein.

12. The apparatus of claim 8 wherein each of said wiper blades includes an integral end cap for sealing with a corresponding end cap of said wiper blade juxtaposed therewith.

13. The apparatus of claim 8 wherein the force produced by said biasing means effectively offsets a portion of the backpressure produced by the viscous material acting against the stencil.

14. An apparatus for compressing a viscous material through openings in a stencil, comprising:

a reservoir containing a supply of the viscous material;

a pressure source operably connected to said reservoir for applying pressure to compress the viscous material;

a housing having a first opening in fluid communication with said reservoir, and having a pair of shearing blades forming a second opening of variable cross-sectional area between the distended ends thereof for expelling the viscous material under pressure into the openings in the stencil moving adjacent thereto; and means for biasing said shearing blades into sliding communication against the stencil and responsive thereto varying the cross-sectional area of said second opening.

15. The apparatus of claim 14 wherein said distended ends of said shearing blades are aligned substantially parallel to each other.

16. The apparatus of claim 14 wherein end sections of said shearing blades include juxtaposed integral caps for slidingly engaging each other to seal end sections of said second opening.

17. The apparatus of claim 14 wherein said biasing means comprise springs operatively interposed between said shearing blades and said housing.

18. The apparatus of claim 17 wherein said biasing means exert a biasing force generally parallel to the plane of each of said shearing blades for increasing the cross-sectional area of said second opening as each of said shearing blades is compressed against the stencil.

19. The apparatus of claim 18 wherein said distended ends of said shearing blades are inflexible for resisting the flow of viscous material thereunder.

20. The apparatus of claim 14 wherein said pair of shearing blades form a V-shaped neck defining said second opening at the distended ends thereof.

21. The apparatus of claim 14 wherein the force produced by said biasing means offsets a portion of the backpressure produced by the pressurized viscous material acting against the stencil.

\* \* \* \* \*